(12) United States Patent
Liu

(10) Patent No.: US 7,734,848 B2
(45) Date of Patent: Jun. 8, 2010

(54) SYSTEM AND METHOD FOR FREQUENCY OFFSET TESTING

(75) Inventor: Jinlei Liu, Hollister, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/595,640

(22) Filed: Nov. 8, 2006

(65) Prior Publication Data

US 2008/0109579 A1  May 8, 2008

(51) Int. Cl.
*G06F 3/00* (2006.01)
*G06F 13/00* (2006.01)
*G06F 15/16* (2006.01)
*G06F 19/00* (2006.01)
*G01R 35/00* (2006.01)
*G01R 27/28* (2006.01)

(52) U.S. Cl. .............................. 710/58; 710/29; 710/34; 710/60; 709/233; 702/110; 702/118; 702/124; 702/125

(58) Field of Classification Search .................... 710/58, 710/29, 34, 60; 709/233; 702/110, 118, 702/124, 125
See application file for complete search history.

(56) References Cited

U.S. PATENT DOCUMENTS

| | | | | |
|---|---|---|---|---|
| 6,002,671 | A  * | 12/1999 | Kahkoska et al. | 370/248 |
| 6,445,773 | B1 * | 9/2002 | Liang et al. | 379/1.04 |
| 2002/0103618 | A1 * | 8/2002 | Schleifer et al. | 702/176 |
| 2005/0069031 | A1 * | 3/2005 | Sunter et al. | 375/224 |
| 2005/0240698 | A1 * | 10/2005 | Rentschler et al. | 710/125 |
| 2006/0149492 | A1 * | 7/2006 | Guidry | 702/117 |
| 2007/0239389 | A1 * | 10/2007 | Heaton et al. | 702/118 |

* cited by examiner

*Primary Examiner*—Niketa I Patel
(74) *Attorney, Agent, or Firm*—Holland & Hart, LLP

(57) ABSTRACT

Described is a system and method for frequency offset testing. The system comprises an electronic device, a first testing device providing a reference clock signal at a first frequency to the electronic device, and a second testing device receiving data from the electronic device at the first frequency and transmitting data to the electronic device at a second frequency. The second frequency is equal to a product of the first frequency and a frequency offset value.

17 Claims, 3 Drawing Sheets

SYSTEM AND METHOD FOR FREQUENCY OFFSET TESTING

BACKGROUND

Newly manufactured electronic devices are tested to =measure actual performance against expected performance. The expected performance may be performance metrics defined by a manufacturer or in an industry standard. For example, an electronic device which purports to be compliant with the Peripheral Component Interconnect-Express (PCI-Express) specification must meet the performance metrics defined therein. For example, a compliance requirement defined in the PCI-Express specification states that a PCI-Express compliant device should be able to support data communication on a high-speed link in the case of a frequency difference or offset between incoming high-speed data from a remote PCI-Express device and outgoing high-speed data from the device.

Traditionally, testing the above-mentioned compliance requirement was performed using bench-type equipment consisting of high-speed signal generators and signal analyzers which are clocked by independent clock sources. Using the bench-type equipment is economically viable only when testing devices with a single high-speed port. However, for high volume production, an automatic test equipment (ATE) system containing many digital channel resources is used. Thus, there is a need for a more efficient frequency offset test.

SUMMARY OF THE INVENTION

The present invention relates to a system and method for frequency offset testing. The system comprises an electronic device, a first testing device providing a reference clock signal at a first frequency to the electronic device, and a second testing device receiving data from the electronic device at the first frequency and transmitting data to the electronic device at a second frequency. The second frequency is equal to a product of the first frequency and a frequency offset value.

DETAILED DESCRIPTION

Figure 1:
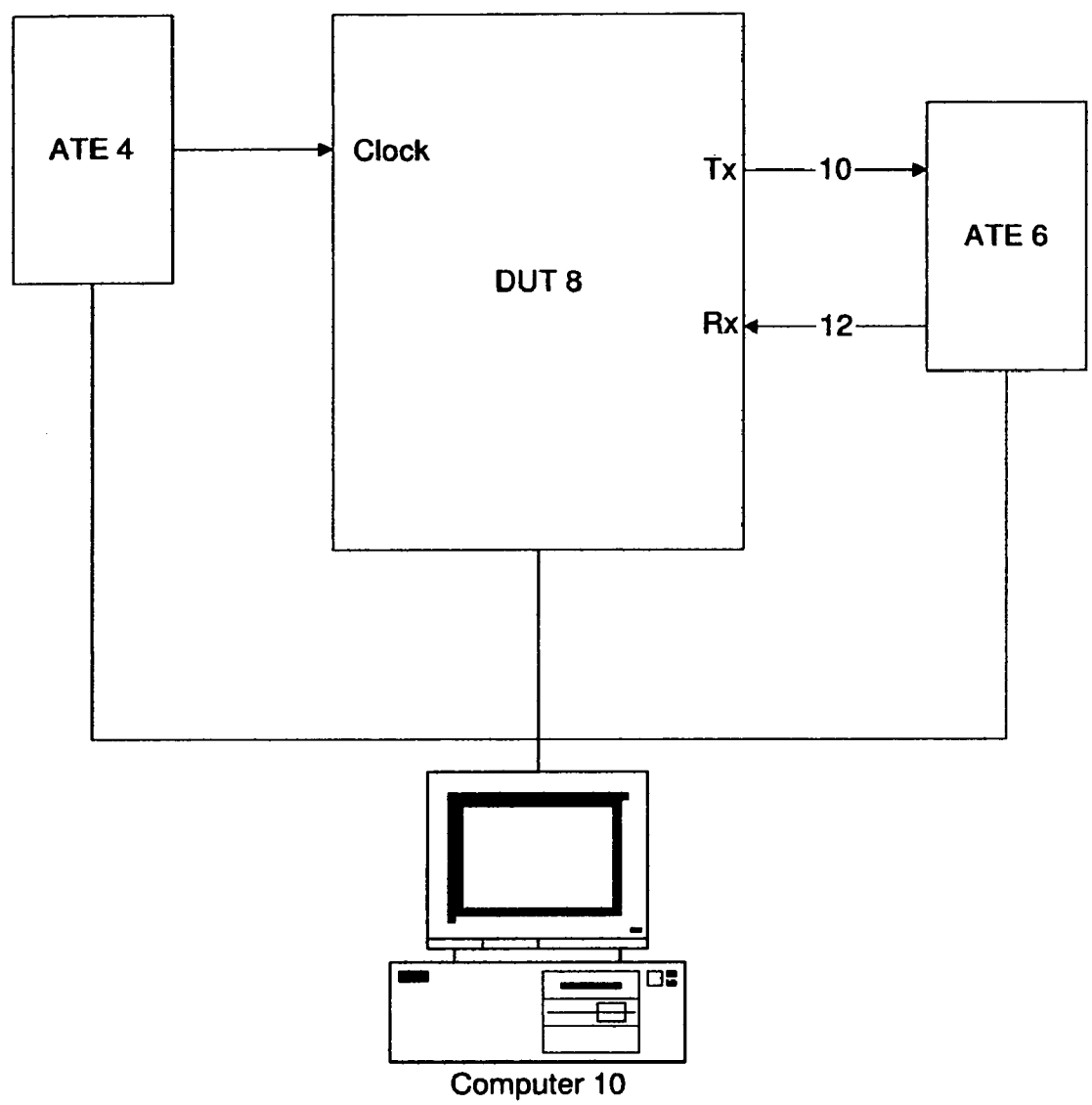
FIG. 1 shows an exemplary embodiment of a system according to the present invention.

The present invention may be further understood with reference to the following description and the appended drawings, wherein like elements are referred to with the same reference numerals. The present invention describes a system and method for performing a frequency offset test on an electronic device. The exemplary embodiments of the present invention will be described with reference to the test being conducted using performance metrics defined in the Peripheral Component Interconnect-Express (PCI-Express) specification. Thus, the test determines whether the electronic device is compliant with at least one of the performance metrics defined in the PCI-Express specification. Those of skill in the art will understand that the present invention may be utilized to test electronic devices manufactured in accordance with various SerDes standards and specifications such as, for example, Serial ATA, Fiber Channel, Gigabit Ethernet, etc.

FIG. 1 shows an exemplary embodiment of a system 2 for performing a frequency offset test according to the present invention. The system 2 includes first and second automatic test equipment (ATE) devices (or digital channels) 4 and 6 which are electrically coupled to a device under test (DUT) 8. The system 2 may further include a computer 10 (e.g., PC, laptop, tablet, etc.) which is coupled to the DUT 8 and/or the ATE devices 4 and/or 6. The computer 10 (or any of the DUT 8 and the ATE devices 4 and 6) may include a memory storing a set of instructions for implementing the frequency offset test. The computer 10 may include an output device, e.g., display screen, printer, etc., for outputting results of the frequency offset test.

In the exemplary embodiment, the DUT 8 is an electronic device (e.g., video card, sound card, high speed memory device, etc.) which purports to operate in accordance with the PCI-Express specification and, in particular, the frequency offset performance metric defined therein. Thus, the DUT 8 may be any device in a consumer electronic or high-end engineering application, such as satellite, data- and telecommunications. The DUT 8 may implement, for example, a System-on-a-Chip (SoC) or a System-in-a-Package (SIP) architecture. The ATE devices 4 and 6 may be SoCs which include a microprocessor, memory and a plurality of application specific integrated circuits (ASICs) implementing a test-per-pin architecture in which each pin of the DUT 8 may be tested independently. For example, the ATE devices 4 and 6 may be the digital testing channels.

The PCI-Express specification defines an improvement over conventional PCI technology. Unlike the conventional PCI technology which utilizes a shared bus architecture in which devices coupled to the bus arbitrate amongst themselves for access thereto, the PCI-Express specification defines a point-to-point topology in which each device has a direct and exclusive access to the bus. A PCI-Express bus acts like a switch establishing intermittent point-to-point connections (e.g., between a device and CPU) and routing data traffic over these connections. While the device and the CPU may believe they are communicating in a data stream over a continuous link, the PCI-Express bus breaks up the stream into discrete packets and routes the packets accordingly. The PCI-Express bus can also implement a prioritization scheme to provide quality of service (QoS) so that real-time streaming packets (e.g., video, audio) are afforded priority over packets that are not as time-critical. Thus, the PCI-Express bus utilizes a SerDes (serialize-deserialize) technique where transmitting and receiving ports operate at different data rates. For example, the PCI-Express bus may be located inside a PC, and a PCI-Express device (e.g., a video card) may be located on a monitor of the PC. Both the bus and the device use local crystals as clock sources, which are, by default, operating at different respective clock rates.

A connection between the PCI-Express bus and a PCI-Express compliant device is referred to as a link and is composed of one or more lanes. Each of the lanes is capable of transmitting one byte of data in both directions simultaneously, because the lane is comprised of a transmit line and a receive line. For example, as shown in FIG. 1, transmit and receive lines 10 and 12 of the DUT 8 connect to input and output ports, respectively, of the ATE device 6, forming a single lane therebetween. The lines break down multi-byte packets into a series of one byte transmissions which are sent in rapid succession. The device on the receiving end collects all of the bytes and reassembles them into the complete multi-byte packet. The PCI-Express specification supports links with 1, 2, 4, 8, 12, 16 and 32 lanes. Because each lane is capable of transmitting data at 2.5 Gbps in each direction simultaneously, a link between the PCI-Express bus and the PCI-Express compliant device may achieve a theoretical maximum data rate of 80 Gbps in each direction simultaneously.

The PCI-Express specification further states that the transmit and receive lines may operate at a frequency offset of ∀300 parts per million (ppm). The frequency offset may be a result of different physical qualities of timing crystals in clocks of the PCI-Express bus and the PCI-Express device coupled thereto. That is, although the clocks may be synchronized to a predetermined frequency, the different physical qualities of the timing crystals may result in the frequency offset on the transmit and receive lines. Due to the frequency offset, data rates on the transmit and receive lines may differ, i.e., data may be received faster than it is transmitted or vice-versa. For example, when the offset is 300 ppm, the data rate on the transmit line 10 may be 2.5002 Gbps and the data rate on the receive line 12 may be 2.4999 Gbps. If the DUT 8 is truly PCI-Express compliant, it will be able to support bi-directional data transfer and maintain data integrity even in the case of the frequency offset.

The exemplary embodiments of the present invention allow the DUT 8 to be tested with a plurality of frequency offset values (e.g., up to ∀300 ppm in 50 ppm intervals) using a single ATE device (e.g., the ATE device 6) coupled to the transmit and receive lines 10 and 12 of the DUT 8. To generate the frequency offset, the exemplary embodiments utilize a coherent sampling technique implemented by the ATE devices 4 and 6. The coherent sampling technique samples a periodic input signal in which an integer number of cycles of the signal fit into a predetermined sampling window. Mathematically, the coherent sampling technique is expressed by the following formula:

$$f_{in}/f_{sample} = M/N$$

where
$f_{in}$=frequency of periodic input signal
$f_{sample}$=sampling frequency
M=integer number of cycles within the sampling window
N=number of data points in the sampling window.

The formula may be rewritten using periods of the periodic input signal and the clock signal as follows:

$$P_{sample}/P_{in} = M/N$$

where
$P_{in}$=period of periodic input signal
$P_{sample}$=sampling period
M=integer number of cycles within the sampling window
N=number of data points in the sampling window.

In the exemplary embodiment, the $f_{sample}$ is equal to about 2.5 GHz, because the PCI-Express specification states that the data rate for a single lane is 2.5 GHz in both directions simultaneously. The ATE device 4 delivers a clock signal to the DUT 8 so that data transmitted over the transmit line 10 achieves a data rate of 2.5 Gbps. As will be explained in more detail below, the frequency offset between the transmit and receive lines 10 and 12 is created by utilizing a clock signal with a different frequency at the ATE device 6. Thus, the data transfer on the transmit line 10 can be faster or slower, depending on the frequency offset being tested, than the data transfer on the receive line 12.

A repeatable waveform such as, for example, a pseudorandom binary sequence (PRBS) data stream equivalent to 127 bits long ($2^7$-1), may be used as the periodic input signal. However, in other exemplary embodiments, other repeatable patterns of varying bit lengths may be utilized. For example, the PCI-Express specification defines a 40 bit compliance pattern which may be utilized to test compliance of the DUT 8 with the PCI-Express specification. In addition, higher order PRBSs may be utilized such as, for example, $2^9$-1, $2^{10}$-1, $2^{11}$-1, etc. However, use of higher order PRBSs may lengthen a time needed to conduct the test.

The ratio M/N represents the frequency offset to be tested. When testing the frequency offset of ∀300 ppm, the ratio M/N is equal to 1.0003 (1,000,300/1,000,000). If the frequency offset to be tested was ∀200 ppm, the ratio would be equal to 1.0002 (1,000,200/1,000,000). As understood by those of skill in the art, the exemplary embodiments of the present invention may be utilized to test the frequency offset at every value from 1-300 ppm. However, testing every possible frequency offset value may require a significant amount of time. Thus, in a preferred embodiment, the test is executed for each 50 ppm interval between ∀0 ppm and ∀300 ppm.

As stated above, the coherent sampling technique requires an integer number of cycles of the periodic input signal to fit within the sampling window. However, the M divided by the PRBS does not yield an integer (1,000,300/127=7876.378), so these values cannot be used simultaneously to create the desired frequency offset of ∀300 ppm. However, when adjusting the PRBS and/or the M, the ratio M/N must remain equal to the value representing the frequency offset.

In the exemplary embodiment, if the PRBS remains at 127 bits long, the M is adjusted to 1,003,300 and the N is adjusted to 1,003,000. Those of skill in the art will understand that M and N may be reduced to 10,033 and 10,030, respectively, by dividing by 100. The reduced values are mutual primes and cannot be divided further by a common factor. Using these values, the M is an integer multiple of the PRBS (1,003,300/127=7900), and the ratio M/N is approximately equal to 1.0003 (1,003,300/1,003,000=1.0003). Those of skill in the art will understand that the PRBS may be varied to any other value so long as it represents a repeatable waveform. Additionally, if the PRBS is changed, the M and the N may have to be changed as well to meet the other requirements of the coherent sampling technique.

Once the PRBS and the values for the M and the N have been determined, the ATE devices 4 and 6 may be configured to effect the frequency offset test on the DUT 8. As stated above, the ATE device 4 is configured to supply the DUT 8 with a reference clock signal at a first frequency. For example, the ATE device 4 may supply the reference clock signal at 2.5 GHz which has a period of 400 ps. The DUT 8, using the reference clock signal, may be programmed to transmit on the transmit line 10 the periodic input signal (e.g., the PRBS) to the ATE device 6 at 2.5 GHz. The ATE device 6 is configured to utilize a clock signal equal to the first frequency multiplied by the ratio N/M. Thus, for the frequency offset test of ∀300 ppm (ratio=M/N=1.0003), the ATE device 6 may transmit a digital pattern (e.g., the PRBS, a compliance pattern, a predefined data pattern, etc.) to the DUT 8 on the receive line 12 at approximately 2.49925 GHz (2.5/1.0003) which has a period of 400.12 ps.

During the test, the PRBS bit stream is digitally captured at the ATE device 6. Simultaneously, data that was transmitted by the ATE device 6 over the receive line 12 may be verified by the DUT 8, but has to be clocked at approximately 2.49925 GHz, which is different from the reference clock signal provided by the ATE device 4. In both instances, with the frequency offset test, it may be determined whether both the transmit and receive lines 10, 12 are operating properly, and, in terms of their clocks, independently.

Figure 2:
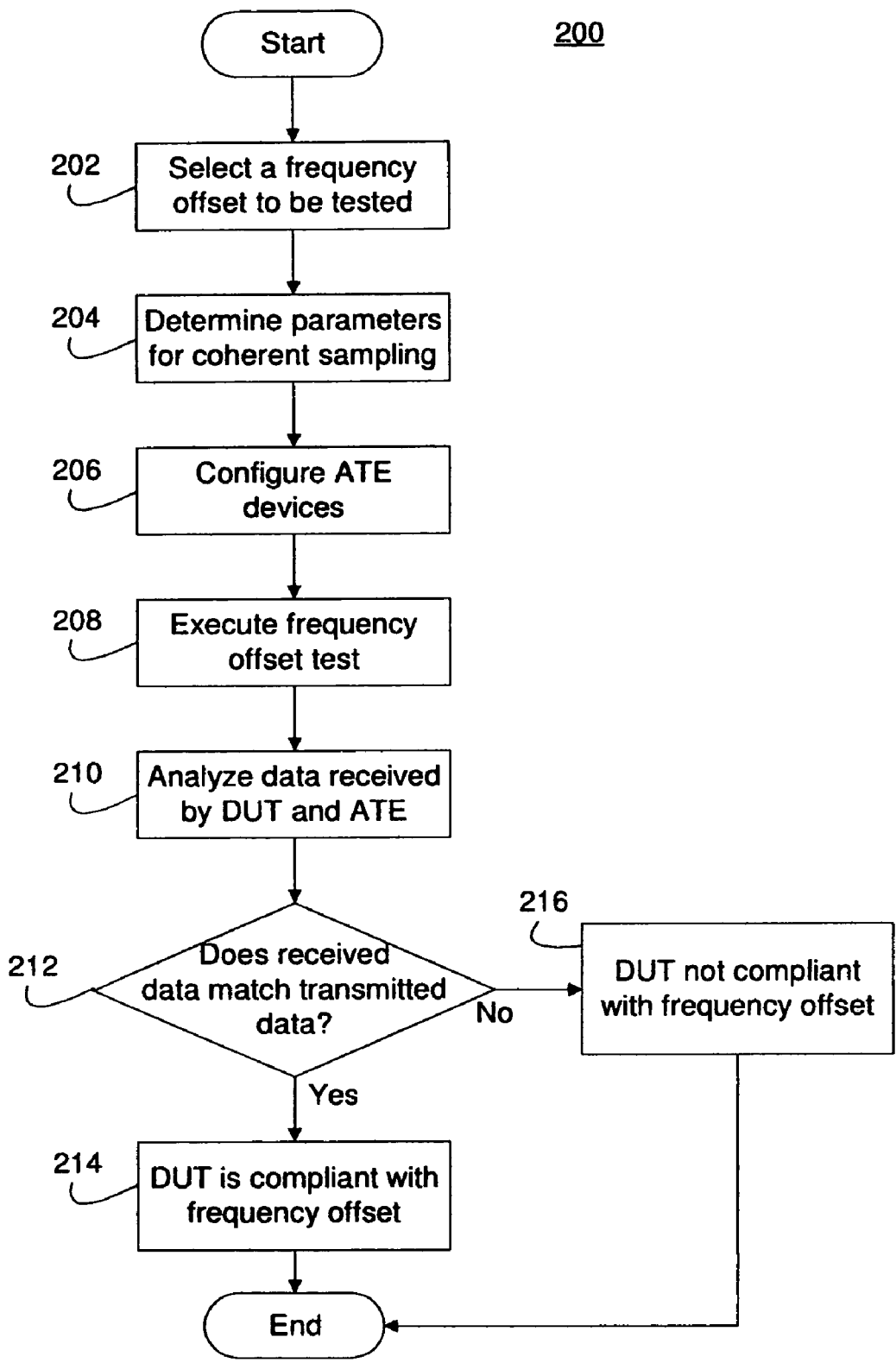
FIG. 2 shows an exemplary embodiment of a method according to the present invention.

FIG. 2 shows an exemplary embodiment of a method 200 for performing a frequency offset test according to the present invention. The method 200 will be described with reference to the exemplary embodiment of the system 2 shown in FIG. 1. Thus, prior to execution of the method 200, the ATE device 4 may be coupled to a clock signal port of the DUT 8, and the ATE device 6 may be coupled to the transmit and receive lines 10 and 12. The DUT 8 and/or the ATE devices 4 and 6 may be coupled to the computer 10.

In step 202, the frequency offset that is to be tested is selected. While this selection may be manual (user-selected), the computer 10 may automatically execute the frequency offset test for a plurality of values (e.g., 50 ppm intervals up to ∀300 ppm) and output the results in real-time or after the test is complete. In the exemplary embodiment, the desired frequency offset is ∀300 ppm.

In step 204, parameters for the coherent sampling technique are determined for the selected frequency offset. As described above, the coherent sampling technique samples a periodic signal in which an integer number of cycles of the signal fit into a predetermined sampling window. In the exemplary embodiment, the periodic input signal is the PRBS of 127 bits. Thus, the ratio M/N is adjusted so that the division of M by the PRBS yields an integer but remains at 1.0003, a representation of the selected frequency offset. To fulfill these requirements, the M is adjusted to 10,033 and the N is adjusted to 10,030.

In step 206, the ATE devices 4 and 6 are configured as a function of the parameters determined in step 204. The ATE device 4 is configured to supply the DUT 8 with a reference clock signal at a first frequency of 2.5 GHz which has a period of 400 ps. Thus, the DUT 8 will transmit data to the ATE device 6 at 2.5 GHz. The ATE device 6 is configured to utilize a clock signal which is represented as the first frequency multiplied by the ratio N/M.

In step 208, the frequency offset test is executed. The PRBS is continually transmitted from the DUT 8 to the ATE device 6 over the transmit line 10 and, simultaneously, a digital pattern (e.g., the PRBS) is transmitted from the ATE device 6 to the DUT 8 over the receive line 12. In step 210, the received data is verified by the DUT 8 internally against a predefined pattern configure by the test program.

Figure 3:
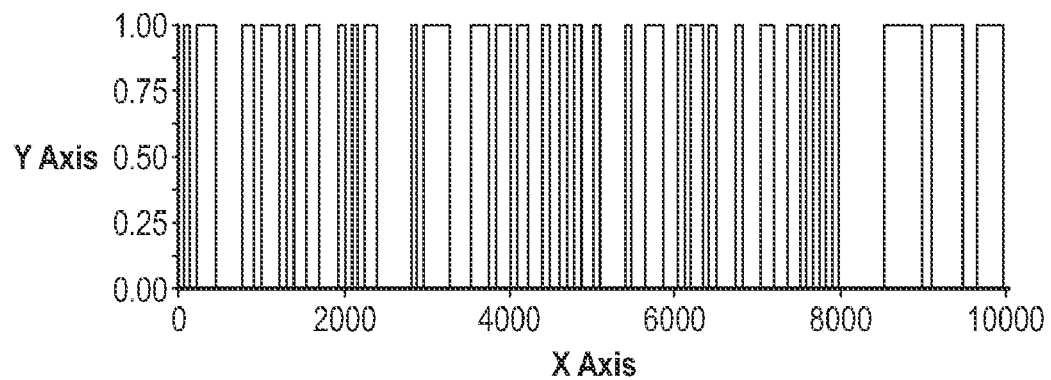
FIG. 3 shows an exemplary embodiment of a waveform obtained from an automatic test equipment device according to the present invention.

In step 212, it is determined whether the received data is substantially similar to the transmitted data. The receive data may be reshuffled and displayed (e.g., on the computer 10) as a complete waveform (as shown in FIG. 3), and the waveform may be compared to the PRBS. In one exemplary embodiment, the received data must completely match the transmitted data, while in other exemplary embodiments, a predefined error bound may be utilized. For example, the received data need not be an exact match of the transmitted data, as long as the received data is different therefrom by less than the predefined error bound. If the received data is within the predefined error bound, the received data may be considered a 'Pass' for the frequency offset tested.

In step 214, the received data at the DUT 8 matches the transmitted data (e.g., the predefined pattern from the ATE device 6) and the data received over the transmit line 10 by the ATE device 6 is digitally captured and processed by the computer 10. Thus, the DUT 8 may be considered compliant with the frequency offset that was tested. For example, in the exemplary embodiment, the DUT 8 may be considered compliant with the frequency offset of ∀300 ppm. The test may be re-run at other frequency offsets to determine whether the DUT 8 is compatible with, for example, the performance metrics set forth in the PCI-Express specification. In step 216, the received data is not correctly verified (e.g., does not match the transmitted data) on the transmit and/or receive lines 10, 12, and thus the DUT 8 is not compliant with the frequency offset that was tested.

Figure 4:
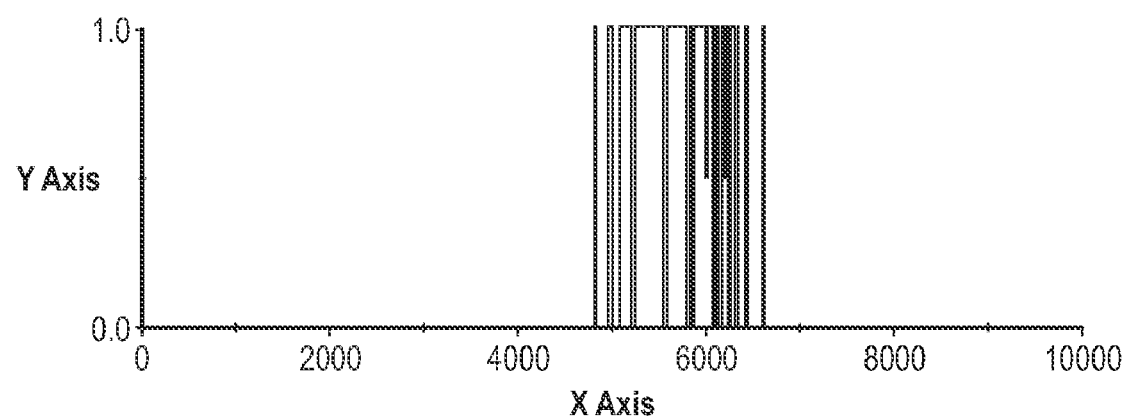
FIG. 4 shows an exemplary embodiment of a jitter measurement according to the present invention.

The data analysis in step 210 may further include a jitter measurement on the received data at the DUT 8 and/or the ATE device 6. That is, the PCI-Express specification defines a jitter threshold of approximately 150 ps. The jitter threshold is defined to limit crosstalk on the transmit and receive lines 10 and 12, i.e., interference on either line from simultaneous data transmission on the other line. The processed data waveform may undergo a derivative operation. FIG. 4 shows the waveform of FIG. 3 after the derivative signal has been reshuffled to gather transitions close together. As shown on FIG. 4, the jitter measurement for the received data is approximately 71 ps which is less than the jitter threshold defined in the PCI-Express specification.

Those of skill in the art will understand that by digitally capturing data at the ATE device 6 and the DUT 8, no bit-to-bit or byte-to-byte alignment is required. Additionally, analysis of the captured data may provide information regarding data pattern integrity, jitter and rise and fall time. Also, an FFT evaluation of the captured data may be conducted.

It will be apparent to those skilled in the art that various modifications may be made in the present invention, without departing from the spirit or scope of the invention. Thus, it is intended that the present invention cover the modifications and variations of this invention provided they come within the scope of the appended claims and their equivalents.

What is claimed is:

1. An automatic test equipment device, comprising:
an input receiving first data from an electronic device at a first frequency, the first frequency corresponding to a reference clock signal, and the first data being a repeatable waveform; and
an output transmitting second data to the electronic device at a second frequency, the second frequency being equal to a product of the first frequency and a frequency offset value, the frequency offset value being equal to a ratio of (i) an integer number of cycles of the repeatable waveform in a sampling window to (ii) a number of data points in the sampling window, and the frequency offset value also being equal to a ratio of (iii) the first frequency to (iv) a sampling frequency of the repeatable waveform used by the automatic test equipment, wherein the automatic test equipment device is configured to coherently sample the repeatable waveform at the sampling frequency over the sampling window.

2. The device according to claim 1, wherein the electronic device is one of a video card, a sound card and a memory device.

3. The device according to claim 1, wherein the electronic device utilizes a high-speed interface.

4. The device according to claim 3, wherein the high-speed interface is one of PCI-Express, Serial ATA and SerDes.

5. The device according to claim 1, wherein the repeatable waveform is one of (i) a pseudorandom binary sequence (PRBS) having a length of one of $2^7-1$ bits, $2^9-1$ bits, $2^{10}-1$ bits and $2^{11}-1$ bits, (ii) a forty bit compliance pattern and (iii) a repeatable data pattern.

6. The device according to claim 1, further comprising:
a buffer storing the first data.

7. A method, comprising:
receiving first data from an electronic device at a first frequency, the first frequency corresponding to a reference clock signal, and the first data being a repeatable waveform;
sampling the received first data at a sampling frequency over a sampling window; and
transmitting second data to the electronic device at a second frequency, the second frequency being equal to a product of the first frequency and a frequency offset value, the frequency offset value being equal to a ratio of (i) an integer number of cycles of the repeatable waveform in the sampling window to (ii) a number of data points in the sampling window, and the frequency offset value also being equal to a ratio of (iii) the first frequency to (iv) a sampling frequency of the repeatable waveform used by the automatic test equipment.

8. The method according to claim 7, further comprising:
storing the first data in a buffer; and
capturing the first data digitally.

9. The method according to claim 7, further comprising:
determining a correlation between the first data and data transmitted by the electronic device.

10. The method according to claim 9, further comprising:
determining whether the electronic device supports data exchange at the frequency offset value as a function of the correlation.

11. The method according to claim 10, further comprising:
determining that the electronic device supports the data exchange at the frequency offset value when the correlation is indicative of one of (i) a complete match and (ii) a match within a predefined error bound.

12. The method according to claim 7, further comprising:
reorganizing the first data into a complete waveform;
computing a derivative of the complete waveform to detect transitions therein; and
grouping the transitions to measure a jitter of the first data.

13. The method according to claim 12, further comprising:
determining whether the electronic device supports data exchange at the frequency offset value as a function of the jitter.

14. The method according to claim 10, further comprising:
determining that the electronic device supports the data exchange at the frequency offset value when the jitter is less than a predetermined jitter threshold.

15. The method according to claim 7, wherein the first frequency corresponds to a reference clock signal received by the electronic device from an automatic test equipment device.

16. The method according to claim 7, wherein the second data is a predefined data pattern.

17. A system, comprising:
an electronic device;
a first testing device providing a reference clock signal at a first frequency to the electronic device;
a second testing device receiving first data from the electronic device at the first frequency and transmitting second data to the electronic device at a second frequency, the second frequency being equal to a product of the first frequency and a frequency offset value, the first data being a repeatable waveform, the frequency offset value being equal to a ratio of (i) an integer number of cycles of the repeatable waveform in a sampling window to (ii) a number of data points in the sampling window, and the frequency offset value also being equal to a ratio of (iii) the first frequency to (iv) a sampling frequency of the repeatable waveform used by the automatic test equipment, wherein the second testing device is configured to coherently sample the repeatable waveform at the sampling frequency over the sampling window.

* * * * *

UNITED STATES PATENT AND TRADEMARK OFFICE
CERTIFICATE OF CORRECTION

PATENT NO. : 7,734,848 B2  Page 1 of 1
APPLICATION NO. : 11/595640
DATED : June 8, 2010
INVENTOR(S) : Jinlei Liu It is certified that error appears in the above-identified patent and that said Letters Patent is hereby corrected as shown below:

Column 1, line 6, "tested to =measure" should read --tested to measure--

Signed and Sealed this

Third Day of August, 2010

David J. Kappos
*Director of the United States Patent and Trademark Office*